United States Patent [19]
Pressley et al.

[11] Patent Number: 4,869,671
[45] Date of Patent: Sep. 26, 1989

[54] ELECTRICAL CONNECTOR FOR PRINTED CIRCUIT BOARD

[75] Inventors: Allan H. Pressley, East Stroudsburg, Pa.; David L. Zick, Johnson City, N.Y.

[73] Assignee: Instrument Specialties Co., Inc., Delaware Water Gap, Pa.

[21] Appl. No.: 158,531

[22] Filed: Feb. 22, 1988

[51] Int. Cl.⁴ ............................................. H01R 9/09
[52] U.S. Cl. ......................................... 439/55; 439/83; 439/507; 361/410
[58] Field of Search ................. 439/55, 78, 81, 83, 439/87, 90, 507, 509–511, 514, 908, 933, 934, 937; 361/400, 403–405, 410

[56] References Cited
U.S. PATENT DOCUMENTS

| | | | |
|---|---|---|---|
| 2,668,932 | 2/1954 | Kliever | 317/101 |
| 3,309,579 | 3/1967 | St. Louis et al. | 317/101 |
| 3,721,944 | 3/1973 | Weidler | 439/511 |
| 3,795,884 | 3/1974 | Kotaka | 339/17 LM |
| 3,852,887 | 12/1974 | Munro | 339/17 LM |
| 3,924,915 | 12/1975 | Conrad | 339/17 F |
| 3,971,610 | 7/1976 | Euchoff et al. | 339/17 R |
| 4,000,054 | 12/1976 | Marcantonio | 361/410 |
| 4,188,714 | 2/1980 | Jean | 439/507 |
| 4,295,700 | 10/1981 | Sado | 339/17 M |
| 4,326,239 | 4/1982 | Ohsawa et al. | 361/410 |
| 4,509,099 | 4/1985 | Takamatsu et al. | 339/17 LM |
| 4,673,967 | 6/1987 | Hingorany | 361/403 |
| 4,777,564 | 10/1988 | Derfiny et al. | 361/405 |

Primary Examiner—P. Austin Bradley
Attorney, Agent, or Firm—Burns, Doane, Swecker & Mathis

[57] ABSTRACT

An electrical conductor fashioned from an electrically conductive material such as copper has a body portion and a pair of laterally extending legs. The body portion and the legs cooperate to define a recess which is substantially filled with an insulating material. That insulating material has a surface recessed from the ends of the legs toward the body portion that, along with the surface of the printed circuit board defines a gap which is suitably sized to receive an epoxy adhesive for temporarily attaching the electrical conductor to the printed circuit board.

20 Claims, 2 Drawing Sheets

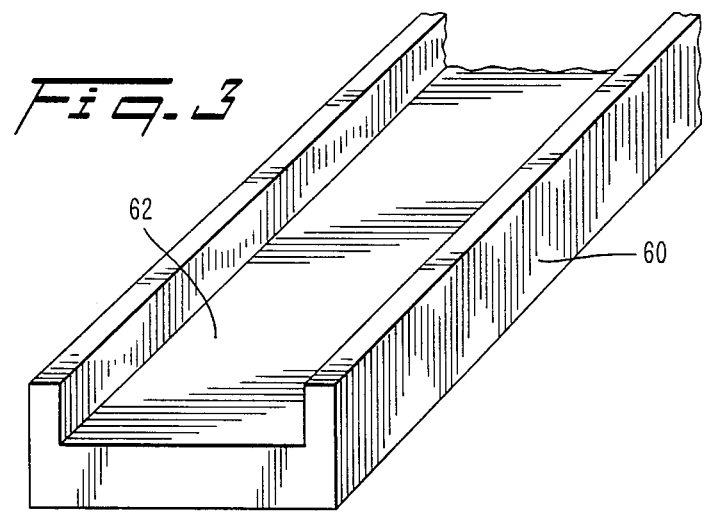
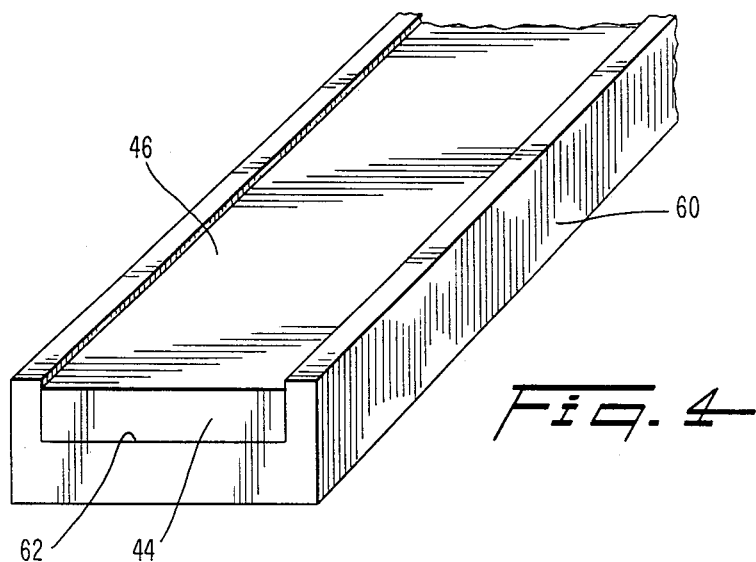

ELECTRICAL CONNECTOR FOR PRINTED CIRCUIT BOARD

BACKGROUND OF THE INVENTION

The present invention relates generally to electrically conductive connectors. In particular, the present invention concerns an electrically conductive connector suitable for electrically connecting spaced-apart conductors of a printed circuit board.

With the current emphasis on miniaturization of electronic circuits, it becomes more and more important to densely pack integrated circuits, transistors, capacitors, resistors, and similar electronic components on a printed circuit board. In the past, those various leaded electronic components have generally been applied to only one side of a printed circuit board. Recently with the advent of surface mount technology, devices can be applied to both the top and bottom of the printed circuit board.

The application of those electronic components to just one side of the printed circuit board has some practical reasons as well. In particular, the means for soldering those electronic components to the printed circuit board is uniquely adapted to providing the components on just one side of the board. For example, in the conventional wave-soldering technique, a printed circuit board is prepared by inserting the electronic component leads through the component side (e.g., top) of the board so that the leads of the electronic components extend through the board and through the appropriate conductor paths on the conductor side (e.g., bottom) of the circuit board. Then, the conductor side of the printed circuit board is passed over a wave of molten solder. That molten solder is wicked into the region surrounding each lead and its associated conductor path to effect the electrical connection. Thus, the wave-soldering technique provides a very efficient means for making a large number of electrical connections essentially simultaneously.

One of the common limitations in printed circuit board design is the location of the conductor paths between electronic components. More particularly, it is not possible with known technology to have conductor paths cross one another on the same conductor plane on a printed circuit board. This fact makes the layout and design of printed circuit boards more difficult than the design of wired circuits where insulated wires can cross one another at the whim of the designer. The limitation of printed circuit board design can conveniently be thought of as inherent in the two-dimensional nature of the printed circuit board as opposed to the three-dimensional nature of wired circuits using insulated conductors.

The present invention provides a means for removing the two-dimensional limitations of printed circuit board design while maintaining the ability to use the wave-soldering technique.

Known devices simply do not provide the kind of relief from prior two-dimensional constraints of circuit board design. For example, it is known to make a U-shaped resistor element out of a potted carbon material and use that resistor as an electronic component in a printed circuit board. See, for example, U.S. Pat. No. 2,668,932 issued to Kliever on Feb. 9, 1954. Likewise, it is known to use solid conductors embedded in various configurations in shaped blocks of insulating material for making contact between conductors of adjacent circuit boards. See, for example, U.S. Pat. No. 3,795,884 issued to Kotaka on Mar. 5, 1974; U.S. Pat. No. 3,852,878 issued to Munro on Dec. 10, 1974; U.S. Pat. No. 4,295,700 issued to Sado on Oct. 20, 1981; and U.S. Pat. No. 4,509,099 issued to Takamatsu et al. on Apr. 2, 1985. It is also known to use flat conductors wrapped in a generally U-shaped configuration about a substantially square insulating member for making electrical contacts between adjacent printed circuit boards. See, for example, U.S. Pat. No. 3,924,915 issued to Conrad on Dec. 9, 1975.

Insulating material blocks with specially configured grooves to hold conductors of electrical components have been proposed. See, for example, U.S. Pat. No. 3,309,579 issued to St. Louis et al. on Mar. 14, 1967. However, such blocks are not believed to have applicability to printed circuit boards.

Electrically conductive silicon rubber elastomers are known for use in making electrical connections between components on opposite sides of a printed circuit board and for making electrical contact buttons. See, for example, U.S. Pat. No. 3,971,610 issued to Euchoff et al. on July 27, 1976.

It will, however, be appreciated by those skilled in the art that those references do not reach to the concept of the present invention.

Moreover, it will be apparent to those skilled in the art that the need continues to exist for an electrical connector for use with printed circuit boards that will free the printed circuit board designer from the two dimensional limitation of conductor placement.

OBJECTS AND SUMMARY OF THE INVENTION

It is a general object of the present invention to provide an electrical connector for printed circuit board use that is capable of freeing conductor design from two-dimensional constraints.

It is another object of the present invention to provide an electrical connector which can be used with conventional attachment techniques such as wave-soldering, vapor phase reflow and infrared reflow.

A further object of the present invention is to provide a method of making an electrical connector for printed circuit boards.

An electrical connector for printed circuit boards which satisfies the foregoing, as well as other, objects is characterized by a generally U-shaped element fashioned of a suitable electrical conductor and defining a pair of legs and a recess. The legs of the conductor are adapted to have cross-sectional dimensions corresponding to the width of typical conductor pads on printed circuit boards. That recess is filled with an insulating material and is provided with a recessed surface. The insulating material is effective to prevent solder contact with the conductors that are being bridged, to allow the connector to be temporarily attached to the conductor side of the printed circuit board, and to prevent electrical shorting between the bridged conductor and the electrical connector of the present invention.

To make the electrical connector of the present invention, a suitable electrical conductor like copper is extruded or otherwise shaped into an elongated, U-shaped channel member defining a longitudinal groove. Subsequently, the groove is filled with a suitable insulating material. Thereafter, the filled conductor is cut transversely to make the individual electrical connectors.

BRIEF DESCRIPTION OF THE DRAWINGS

Many additional objects and advantages of the present invention will be apparent to those skilled in the art when this specification is read in conjunction with the attached drawings wherein like reference numeral are applied to like elements and wherein:

FIG. 3 is a view of the material resulting from a first step in the manufacturing process; and FIG. 4 is a perspective view of material after a second step in the manufacturing process.

DESCRIPTION OF THE PREFERRED EMBODIMENT

Figure 1:
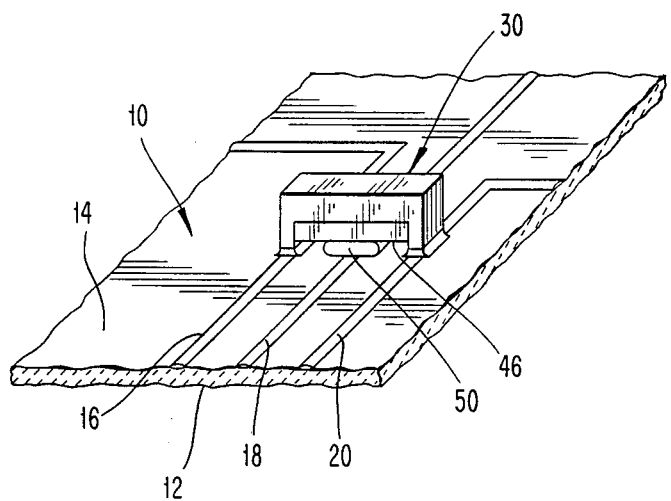
FIG. 1 is a view of a portion of a printed circuit board with the electrical connector of the present invention attached.

A suitable conventional printed circuit board 10 (see FIG. 1) includes a first surface 12 which is adapted to mount various electronic components such as transistors, integrated circuits, capacitors, resistors, inductors, and the like. In addition, the printed circuit board 10 also includes a second surface 14 on which various electrically conducting paths or strips 16, 18, 20 are laid out. These electrically conducting paths are arranged so that the necessary and desired electrical paths are established between various ones of the electronic components mounted on the printed circuit board 10.

As can be seen, the locations of the various electrically conducting strips are sometimes close to one another and at other places are widely spaced from one another. The apparent meandering of the electrically conducting strips is necessary to give the desired performance of the electronic device which employs the printed circuit board 10.

Because the electrically conducting strips 16, 18, 20 are confined to a two-dimensional surface 14 of the printed circuit board 10, the strips often loop around the ends of one another to reach particular electronic components with particular electrical signals. Thus, the two-dimensional limitations of the printed circuit board 10 have operated as a practical limit on the density with which electronic components can be packed on the printed circuit board 10.

In accordance with the present invention, an electrical connector 30 is provided which significantly increases the density with which known electronic components can be packed on a printed circuit board 10. The electrical connector 30 provides a jumper or a bridge between electrically conducting strips 16, 20 which are spaced from one another by another conducting strip 18 which must remain electrically isolated from the conducting strips 16, 20. By incorporating one or more electrical connector 30 in the design of printed circuit board 10, significantly increased flexibility in the conductor strip design is possible. The electrical connector 30 may conveniently be thought of as a device to permit a three-dimensionality in the conductor strip design.

The electrical connector 30 itself (see FIG. 2) is preferably made from a good conductor of electricity. Copper, aluminum, and silver are examples of suitable materials for the electrical connector which are commonly known as good conductors.

The electrical connector 30 preferably includes a body portion 32 which has a generally rectangular cross-sectional shape. The length of the body portion 32 is selected so that it is substantially coextensive with a typical dimension between the outermost edges of two spaced conductor strips of printed circuit board 10. Stated differently, there is ordinarily a minimum conductor strip width and a minimum conductor spacing required in a give printed circuit board 10 design. The body portion 32 can have any one of several predetermined lengths, the selected predetermined length depending on the number of conducting strips to be bridged. With that arrangement, the electrical connector 30 will have a sufficient length to span the distance between two conductor strips while bridging over an intermediate conductor strip or strips.

The body 32 of the electrical connector 30 has a pair of legs 34, 36 which extend laterally therefrom. Preferably, each leg 34, 36 extends from a corresponding end of the body 32. However, it is possible that special applications will exist where three or more laterally extending legs will be provided on the body portion 32. Such a situation would exist, for example, if it was necessary to electrically connect three different conductor strips, each two of which were separated by another conductor strip that must remain insulated from those two.

Each leg 34, 36, has a corresponding end 38, 40. The length of each leg measured from the body portion 32 to its associated end 38, 40 must be such that the body portion 32 is spaced above the intermediate conductor strip on the printed circuit board 10 by a distance which is at least sufficient to prevent electrical arcing with normal current and voltages that are typically used in electronic circuits. It has been found that a convenient length for the legs 34, 36 is 0.040 inches.

The ends 38, 40, of the legs 34, 36, are preferably coplanar. In any event, the ends 38, 40 define a plane which corresponds to the surface of the printed circuit board 10 to which the electrical connector 30 will be affixed.

For convenience in fabrication, it is preferred that the body 32 and the legs 34, 36, each have the same width measured in the direction transverse to the longitudinal direction of the body portion 32. The width is selected to provide an adequate surface contact between the legs 34, 36, and the associated conductor strips of the printed circuit board 10. A convenient width to work with has been found to be in the range of 0.060 to 0.080 inches.

Each leg 34, 36 also has a thickness measured in the longitudinal direction of the body portion 32. That thickness is preferably selected to be less than the minimum thickness for conductor pads on printed circuit boards. In the present case, it has been found that a thickness of 0.020 inches is convenient.

The facing surfaces of the legs 34, 36 and the surface of the body portion 32 extending therebetween cooperate to define a recess 42. This recess is substantially filled by a suitable, conventional insulating material 44, i.e., a material having a high dielectric strength. It is important the selected insulating material be able to withstand a 3.0 to 8.0 second immersion in a 490° to 510° F. molten solder bath, a 10.0 to 20.0 second exposure to a 419° to 192° F. fluorocarbon atmosphere, and a 20.0 to 40.0 second exposure to a 460° to 480° F. infrared heat with a nitrogen atmosphere without degradation. A suitable material for use as the insulating material is a combination of acrylate and urethane methacrylate.

The insulating material 44 has a surface 46 which is depressed below the plane defined by the surfaces 38, 40 in order to insure that the surface does not project above that plane and to insure a cavity to accommodate any adhesive that may be used. The surface 46 is displaced from the plane by a distance which is selected to accommodate practical manufacturing tolerances. In addition, the surface 46 is sufficient to guarantee that the insulating material 44 does not bulge outwardly above the plane defined by the surfaces 38, 40, but the distance cannot be so great that it is difficult to glue the connector in position without a blob of epoxy cement being present. Typically, a distance in the range of 0.002 to 0.010 inch has been found to be sufficient to meet the requirements expressed above.

A typical application for the electrical connector 30 is illustrated in FIG. 1. Here, the electrical connector 30 is temporarily attached to the conductor side (e.g. bottom) of the printed circuit board 10 by a suitable quantity of adhesive 50. Epoxy glue, for example, can be used as the adhesive 50. The adhesive is applied between the concave surface 46 of the electrical connector 30 and the surface 14 of the printed circuit board 10. With this arrangement, the legs of the electrical connector 30 can be positioned on the associated conductor strips 16, 20.

When the electrical connector 30 has been temporarily secured to the printed circuit board 10, and when the other electronic components have been secured thereto, the printed circuit board 10 can pass through a suitable conventional wave-soldering operation. Molten solder will wick into the space between the ends of the legs and the associated conductor strips 16, 20. Thus, when the solder cools, the electrical connection between the electrical connector 30 and the conductor strips 16, 20 will be complete.

It should be noted that when the length of the body portion exceeds the minimum value described above, the electrical connector 30 may be turned so that its length will match the necessary distance between the conductor strips.

It should also be noted that the electrical connector 30 can be applied to the component side 12 (e.g., top) of the printed circuit board 10, if desired. Such a mounting location can be effected by, for example, applying solder paste to the pads and passing the printed circuit board through a vapor phase or infrared solder reflow process. The reflow process will cause the solder paste to become molten and electrically attach the electrical connector when it solidifies.

The electrical connector 30 of the present invention is specially adapted to be manufactured in a very efficient manner. For example, a generally U-shaped elongated member 60 (see FIG. 3) can be shaped from a suitable material such as copper, aluminum, or silver. That shaping process can be accomplished by, for example, extruding the parent metal through a suitably shaped die. Alternatively, the shaping process can be accomplished by forming the material in a rolling process.

In either event, the elongated member 60 defines a longitudinal groove 62 which is substantially coextensive with the length of the elongated member 60. This groove 62 is then filled by the insulating material 44 (see FIG. 4). Preferably, the insulating material can be applied in a liquid form so that it is poured into the groove 62. Thus, it is also necessary that the insulating material 44 have good surface adhesion to the surface of the electrically conducting material from which the channel 60 is fabricated.

Either simultaneously with placement of the insulating material 44 in the groove 62, or shortly thereafter, the surface 46 is wiped or tooled to give the desired concavity between the opposing legs of the U-shaped elongated member 60.

Figure 2:
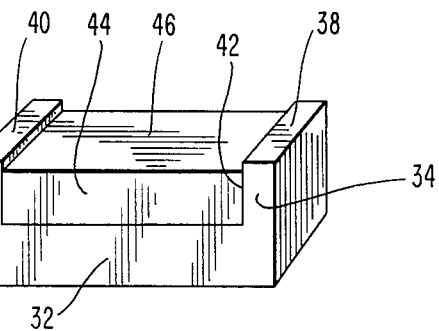
FIG. 2 is an enlarged perspective view of an electrical connector for printed circuit boards according to the present invention.

To finally obtain the electrical connector 30 of FIG. 2, the filled elongated member 60 of FIG. 4 is severed transversely at axially spaced distances which correspond to the desired width of the electrical connector 30. Any suitable severing step can be used including shearing, cutting and the like.

It will now be seen that an electrical connector for a printed circuit board has been disclosed which provides considerable advantages in the design of printed circuit boards. In addition it will be seen that a method has been disclosed which greatly facilitates the manufacture of such electrical connectors. Moreover, it will be seen that this connector and this method satisfy the objects set forth.

From the foregoing, it will be seen that there has been described a new, useful, and unobvious electrical connector for printed circuit boards and a method for making those electrical connectors. Moreover, it will be apparent to those skilled in the art that numerous modifications, variations, substitutions, and equivalents exist for features of the invention which have been described. Accordingly, it is expressly intended that all such modifications, variations, substitutions, and equivalents that fall within the spirit and scope of the appended claims be embraced thereby.

What is claimed is:

1. In combination, a printed circuit board having at least first, second and third spaced apart conducting paths, said second conducting path being provided between said first and third conducting paths, and an electrical connector preformed from an electrically conductive material, said electrical connector having a body portion and first and second leg portions extending away from said body portion in the same direction and substantially parallel to one another so as to form a U-shaped member, each of said first and second leg portions terminating in a substantially flat surface, said substantially flat surface of said first leg portion being substantially coplanar with the substantially flat surface of said second leg portion, said substantially flat surface of said first leg portion having a width which is substantially the same as the width of said first conducting path, said substantially flat surface of said second leg portion having a width which is substantially the same as the width of said third conducting path, said first and second leg portions being spaced apart by a distance corresponding to the distance between said first and third conducting paths, an electrically insulating material substantially filling a recess defined by said body portion and said first and second leg portions, said first leg portion being electrically connected to said first conducting path, said second leg portion being electrically connected to said third conducting path with said insulating material overlying said second conducting path.

2. The combination of claim 1, wherein said electrical connector is fashioned from metal.

3. The combination of claim 1, wherein said insulating material is a dielectric material.

4. The combination of claim 1, wherein said electrical conductor is uniform in cross section and is symmetrical along two planes and wherein each of said substantially flat surfaces of said first and second leg portions is rectangular and has a length which is substantially greater than its width.

5. The combination of claim 1, further comprising means for temporarily holding said electrical connector adjacent to said printed circuit board until said substantially flat surfaces of said first and second leg portions are soldered to said first and third conducting paths.

6. The combination of claim 5, wherein said means for temporarily holding comprises an adhesive material provided between said insulating materials and said second conducting path.

7. The combination of claim 1, wherein said substantially flat surfaces of said first and second leg portions of said electrical connector are soldered to said first and third conducting paths.

8. The combination of claim 7, wherein said substantially flat surfaces of said first and second leg portions of said electrical connector are soldered to said first and third conducting paths by wave-soldering.

9. The combination of claim 7, wherein said substantially flat surfaces of said first and second leg portions of said electrical connector are soldered to said first and third conducting paths by vapor phase reflow soldering.

10. The combination of claim 7, wherein said substantially flat surfaces of said first and second leg portions of said electrical connector are soldered to said first and third conducting paths by infrared reflow soldering.

11. An electrical connector for use with a printed circuit board having at least first, second and third spaced apart conducting paths, said second conducting paths being provided between said first and third conducting paths, said electrical connector comprising:

a body portion and first and second leg portions fashioned from an electrically conductive material, each of said first and second leg portions extending away from said body portion in the same direction and substantially parallel to one another so as to form a U-shaped member, each of said first and second leg portions terminating in a substantially flat surface, said substantially flat surface of said first leg portion being substantially coplanar with the substantially flat surface of said second leg portion, said first and second leg portions being spaced part by a distance corresponding to the distance between said first and third conducting paths of said printed circuit board, an electrically insulating material substantially filling a recess defined by said body portion and said first and second leg portions, whereby said electrical connector may be provided adjacent to said printed circuit board with said substantially flat surface of said second leg portion adjacent to said first conducting path, said second leg portion adjacent to said third conducting path and said insulating material adjacent to said second conducting path.

12. The electrical connector of claim 11, wherein said electrical connector is fashioned from metal.

13. The electrical connector of claim 11, wherein said insulating material is a dielectric material.

14. The electrical connector of claim 11, wherein each of said substantially flat surfaces of said first and second leg portions is rectangular and has a length which is substantially greater than its width.

15. The electrical connector of claim 11, further comprising means for temporarily holding said electrical connector adjacent to said printed circuit board.

16. The electrical connector of claim 15, wherein said means for temporarily holding comprises an adhesive material provided adjacent to said insulating material and between said leg portions.

17. The electrical connector of claim 11, wherein said electrical connector is uniform in cross section and is symmetrical along two planes.

18. The electrical connector of claim 17, wherein each of said substantially flat surfaces of said first and second leg portions is rectangular and has a length which is substantially greater than its width.

19. The electrical connector of claim 18, further comprising means for temporarily holding said electrical connector adjacent to said printed circuit board, said means for temporarily holding comprising an adhesive material provided adjacent to said insulating material and between said leg portions.

20. An electrical connector for use with a printed circuit board, aid electrical connector comprising:

a body portion and first and second leg portions fashioned from an electrically conductive material, each of said first and second leg portions extending away from said body portion in the same direction and substantially parallel to one another so as to form a U-shaped member which is uniform in cross section and symmetrical along two planes, each of said first and second leg portions terminating in a substantially flat surface which is rectangular and which has a length which is substantially greater than its width, said substantially flat surface of said first leg portion being substantially coplanar with the substantially flat surface of said second leg portion, an electrically insulating material substantially filling a recess defined by said body portion and said first and second leg portions, whereby said electrical connector may be positioned adjacent to the printed circuit board with the first leg adjacent to a first conducting path of the printed circuit board, the second leg adjacent to a second conducting path of the printed circuit board and the insulating material overlying a third conducting path provided between said first and second conducting paths of said printed circuit board.

* * * * *